United States Patent
Peng (10) Patent No.: US 10,827,048 B2
(45) Date of Patent: Nov. 3, 2020

(54) CARD TRAY OPENING/CLOSING MECHANISM, CARD TRAY, MOBILE PHONE, AND CARD TRAY OPENING/CLOSING METHOD

(71) Applicant: GUANGDONG EVERWIN PRECISION TECHNOLOGY CO., LTD., Dongguan (CN)

(72) Inventor: Haihua Peng, Dongguan (CN)

(73) Assignee: GUANGDONG EVERWIN PRECISION TECHNOLOGY CO., LTD., Dongguan (CN)

( * ) Notice: Subject to any disclaimer, the term of this patent is extended or adjusted under 35 U.S.C. 154(b) by 0 days.

(21) Appl. No.: 16/471,137

(22) PCT Filed: Nov. 13, 2017

(86) PCT No.: PCT/CN2017/110640
§ 371 (c)(1),
(2) Date: Jun. 19, 2019

(87) PCT Pub. No.: WO2018/121105
PCT Pub. Date: Jul. 5, 2018

(65) Prior Publication Data
US 2019/0335025 A1 Oct. 31, 2019

(30) Foreign Application Priority Data

Dec. 26, 2016 (CN) .............. 2016 1 1217548
Dec. 26, 2016 (CN) .............. 2016 1 1219052

(51) Int. Cl.
*H04M 1/02* (2006.01)
*G06F 1/16* (2006.01)
*H05K 5/02* (2006.01)

(52) U.S. Cl.
CPC .......... *H04M 1/026* (2013.01); *G06F 1/1615* (2013.01); *G06F 1/1675* (2013.01); *H05K 5/0221* (2013.01); *H05K 5/0295* (2013.01)

(58) Field of Classification Search
CPC combination set(s) only.
See application file for complete search history.

(56) References Cited

U.S. PATENT DOCUMENTS

2006/0065718 A1 3/2006 Tsuruta
2018/0260588 A1* 9/2018 Shafir ............... G06K 13/085

FOREIGN PATENT DOCUMENTS

CN 103841229 A 6/2014
CN 105338135 A 2/2016
(Continued)

OTHER PUBLICATIONS

International Search Report for Application No. PCT/CN2017/110640 reported dated Jan. 26, 2018.
(Continued)

*Primary Examiner* — Junpeng Chen
(74) *Attorney, Agent, or Firm* — Carlson, Gaskey & Olds (57) ABSTRACT

A card tray opening/closing mechanism, used for shifting a card in or out of a slot of a mobile phone body. The card tray opening/closing mechanism comprises a transmission assembly and a micro motor; the micro motor is fixedly connected in the mobile phone body, and is used for communicationally connecting to the mobile phone body. The micro motor is connected to the transmission assembly; the transmission assembly is used for connecting to the card tray body; and the micro motor can shift the card tray body in or out of the slot by means of the transmission assembly.

18 Claims, 4 Drawing Sheets

(56) References Cited

FOREIGN PATENT DOCUMENTS

| CN | 105872142 A | 8/2016 |
|---|---|---|
| CN | 105897288 A | 8/2016 |
| CN | 106230453 A | 12/2016 |
| CN | 106603103 A | 4/2017 |
| CN | 106713544 A | 5/2017 |
| CN | 106911344 A | 6/2017 |
| CN | 107104324 A | 8/2017 |
| CN | 2063894515 U | 8/2017 |

OTHER PUBLICATIONS

Chinese Office Action for Chinese Priority Application No. 201811219052.3; Office Action dated May 25, 2018.

\* cited by examiner

CARD TRAY OPENING/CLOSING MECHANISM, CARD TRAY, MOBILE PHONE, AND CARD TRAY OPENING/CLOSING METHOD

CROSS-REFERENCE TO RELATED APPLICATION

This patent application is a 35 USC § 371 U.S. national stage of International Application No. PCT/CN2017/110640 filed on Nov. 13, 2017, which claims priority under the Paris Convention to the Chinese Patent Application No. 201611219052.3 filed on Dec. 26, 2016 and to Chinese Patent Application Serial No. 201611217548.7 filed on Dec. 26, 2016.

TECHNICAL FIELD

The present disclosure relates to a technical field of mobile phone, and particularly relates to a card tray opening and closing mechanism, a card tray, a mobile phone, and a card tray opening and closing method.

BACKGROUND

A mobile phone card tray is used to support a SIM (Subscriber Identification Module) card or a memory card, and the SIM card or the memory card is inserted into a slot of the mobile phone. A conventional mobile phone card tray requires an ejector pin to be pushed out of the slot, therefore it is inconvenient to open the card tray.

SUMMARY

Accordingly, it is necessary to provide a card tray opening and closing mechanism, a card tray, a mobile phone, and a card tray opening and closing method.

A card tray opening and closing mechanism used to move a card tray body into or out of a slot of a mobile phone body includes a micro motor fixedly connected to the mobile phone body, the micro motor is used to be communicatedly connected to the mobile phone body, and a transmission assembly connected to the micro motor, the transmission assembly is configured to be connected to the card tray body, and the micro motor is capable of moving the card tray body into or out of the slot by the transmission assembly.

A card tray used to be mounted in the mobile phone body includes a card tray body and the aforementioned card tray opening and closing mechanism. The card tray body is capable of being moved into or out of the slot via the card tray opening and closing mechanism.

A mobile phone includes a mobile phone body and the aforementioned card tray, and the card tray is mounted in the mobile phone body, the mobile phone body includes a microprocessor, and the micro motor is communicatedly connected to the microprocessor.

A card tray opening and closing method includes following steps:

receiving an open command;

starting up a micro motor located in a mobile phone body and driving an output shaft of the micro motor to rotate, and driving, by the output shaft, the transmission assembly to move toward an exit direction of the card tray body; and driving, by the transmission assembly, the card tray body to be removed from a slot located in the mobile phone body.

According to the aforementioned card tray opening and closing mechanism, card tray, mobile phone, and card tray opening and closing method, the micro motor is communicatedly connected to the mobile phone body, the card tray body is connected to the micro motor through the transmission assembly, after the micro motor receiving a controlling signal from the mobile phone body, the micro motor drives the card tray body to move in the slot by the transmission assembly, and moves the card tray body into or out of the slot. The aforementioned card tray opening and closing mechanism can move the card tray body out of the slot without using the ejector pin, which not only improves the convenience of opening the card tray body, but also avoids the inconvenience of carrying the ejector pin, and the card tray body can be moved into the slot by using the card tray opening and closing mechanism, which improves the convenience of closing the card tray body.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Embodiments of the present disclosure are described more fully hereinafter with reference to the accompanying drawings. A preferred embodiment is described in the accompanying drawings. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

It will be understood that when an element is referred to as being "fixed" to another element, it can be directly fixed to the other element or intervening elements may be present. Also, when an element is referred to as being "connected" or "coupled" to another element, it can be directly connected or coupled to the other element or intervening elements may be present. As used herein, the terms "vertical", "horizontal", "left", "right" and the like are merely for the illustrative purpose.

Unless otherwise defined, all terms (including technical and scientific terms) used herein have the same meaning as commonly understood by one of ordinary skill in the art to which this invention belongs. The terms used herein is for the purpose of describing particular embodiments only and is not intended to limit the present disclosure. As used herein, the term "and/or" includes any and all combinations of one or more of the associated listed items.

Figure 1:
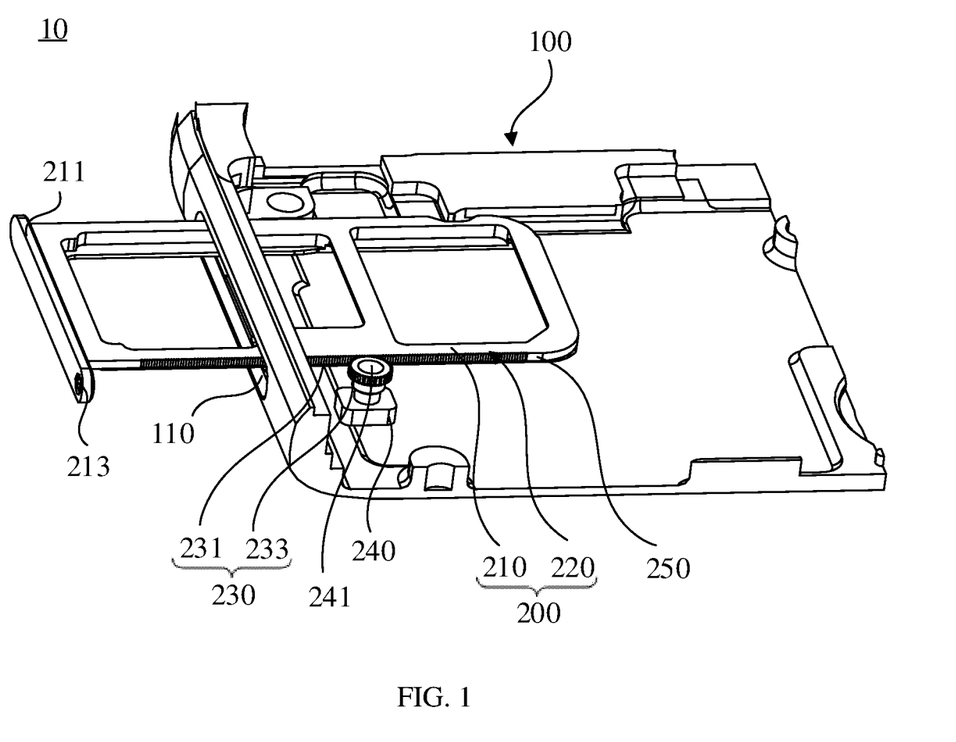
FIG. 1 is a position state diagram of a card tray body of a mobile phone in a position state according to an embodiment.

Referring to FIG. 1, a mobile phone 10 according to an embodiment includes a mobile phone body 100 and a card tray 200. The mobile phone body 100 is provided with a slot 110, and the card tray 200 is mounted in the mobile phone body 100. The card tray 200 further includes a card tray body 210 and a card tray opening and closing mechanism 220, and the card tray body 210 is connected to the card tray opening and closing mechanism 220. The card tray body 210 is mounted in the slot 110, and the card tray opening and closing mechanism 220 can move the card tray body 210 into or out of the slot 110 of the mobile phone body 100. In one of the embodiments, the card tray opening and closing mechanism 220 includes a transmission assembly 230 and a micro motor 240. The micro motor 240 is fixedly connected to the mobile phone body 100, and is connected to the card tray body 210 through the transmission assembly 230. The micro motor is communicatedly connected to the mobile phone body 100. The micro motor 240 can receive a controlling signal from the mobile phone body 100, and realize starting up and stopping. When the micro motor 240 is in operation, the micro motor 240 can move the card tray body 210 out of the slot 110 through the transmission assembly 230. In one of the embodiments, the micro motor can further move the card tray body 210 into the slot 110 by the transmission assembly 230.

According to the aforementioned card tray opening and closing mechanism 220, the micro motor 240 is communicatedly connected to the mobile phone body 100, the card tray body 210 is connected to the micro motor 240 by the transmission assembly 230, after the micro motor 240 receives the controlling signal from the mobile phone body 100, the micro motor 240 drives the card tray body 210 to move in the slot 110 by the transmission assembly 230, and moves the card tray body 210 into or out of the slot 110. The aforementioned card tray opening and closing mechanism 220 can move the card tray body 210 out of the slot 110 without using the ejector pin, which not only improves the convenience of opening the card tray body 210, but also avoids the inconvenience of carrying the ejector pin, and the card tray body 210 can be moved into the slot 110 by using the card tray opening and closing mechanism 220, which improves the convenience of closing the card tray body 210.

It should be noted that, the micro motor 240 can rotate clockwise or counterclockwise. In the embodiment of FIG. 1, the transmission assembly 230 is configured to move the card tray body 210 out of the slot 110 when the micro motor 240 rotates counterclockwise, and move the card tray body 210 into the slot 110 when the micro motor 240 rotates clockwise. In alternative embodiments, the micro motor 240 can be located on another side of the card tray body 210, and in this case, the card tray body 210 moves into the slot 110 when the micro motor 240 rotates counterclockwise, and the card tray body 210 moves out of the slot 110 when the micro motor 240 rotates clockwise.

In one of the embodiments, the mobile phone body 100 includes a microprocessor (not shown), and the micro motor 240 is communicatedly connected to the microprocessor. The micro motor 240 can receive the controlling signal from the microprocessor, and starts up or stops under the control of the microprocessor. When the microprocessor is used to control the micro motor 240, the micro motor 240 can be controlled by a program to start up or stop. In one of the embodiments, the mobile phone 10 is a touch screen mobile phone, and the control program for the micro motor 240 is programmed into an individual application, when the user needs to open or close the card tray body 210, the application can be started to control the card tray body 210 to move in or move out by the operating the touch screen. By this control means, the interaction between the user and the mobile phone body 100 is facilitated, and the user experience can be improved.

In one of the embodiments, the micro motor 240 is a stepper motor. Since the rotation speed and rotation angle of the stepper motor are easy to be controlled accurately by programming, the microprocessor of mobile phone body 100 can be fully utilized to realize a better control by programming.

Figure 2:
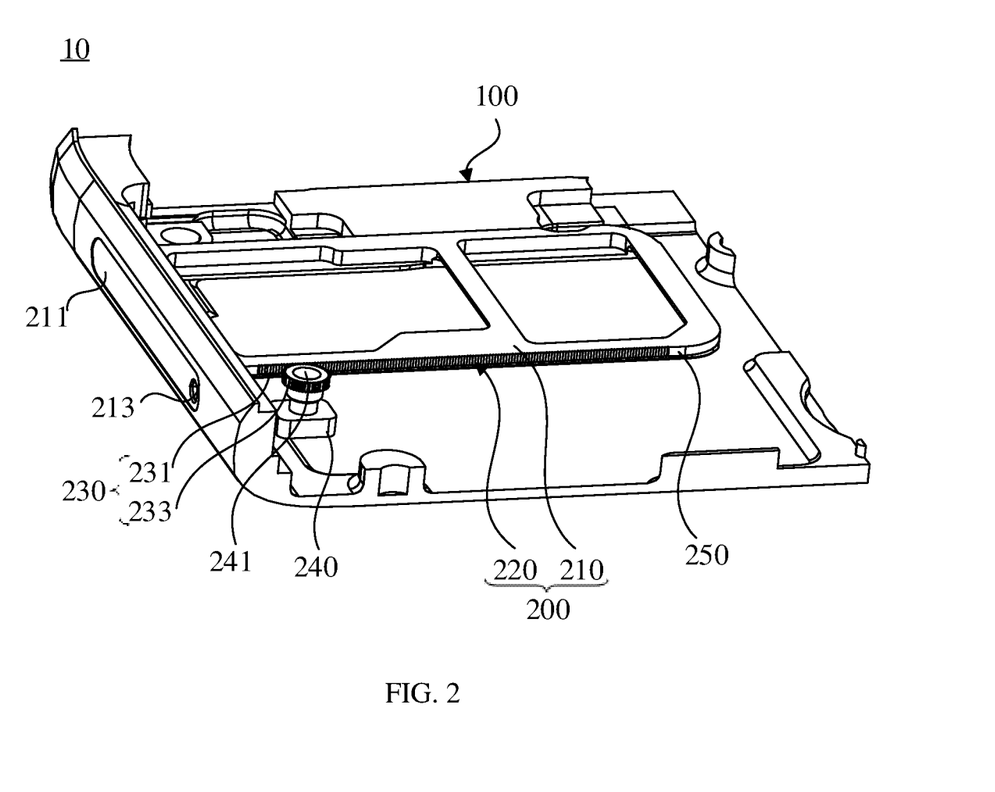
FIG. 2 is another position state diagram of the card tray body in FIG. 1 in an alternative position state.

Referring to FIG. 2, in one of the embodiments, the transmission assembly 230 of the card tray opening and closing mechanism 220 includes a rack 231 and a gear 233. The micro motor 240 is provided with an output shaft 241, the gear 233 is fixedly connected to the output shaft 241. The rack 231 is located on the card tray body 210, and is engaged with the gear 233 on the output shaft 241 of the micro motor 240. When the output shaft 241 of the micro motor 240 rotates, the gear 233 rotates synchronously with the output shaft 241 to drive the rack 231 engaged therewith, thereby moving the card tray body 210 into or out of the slot 110.

It should be noted that, the rack 231 can be integrally formed with the card tray body 210. That is, in the process of fabricating the card tray body 210, the rack 231 is fabricated together. In this case, since the card tray body 210 and the rack 231 are integrally formed, they are easy to manufacture, which can facilitate subsequent assembly. In alternative embodiments, the rack 231 may be detachably connected to the card tray body 210. That is, the rack 231 is mounted on the card tray body 210 after the card tray body 210 is fabricated. The detachable connection means includes various means, for example, a screw may be used to connect the rack 231 to the card tray body 210, and other detachable connection means may also be used. Therefore, the replacement of the rack 231 is facilitated by such a detachable connection.

Referring to FIG. 1, the transmission assembly 230 according to an embodiment is located at a lateral side of the card tray body 210, the rack 231 is located on a side of the card tray body 210 facing the gear 233 and is fabricated with a preset length, and the micro motor 240 is mounted vertically. In alternative embodiments, the rack 231 may also be located on an upper end surface or a lower end surface of the card tray body 210. In this case, the micro motor 240 may be mounted laterally, and the engaging transmission between the gear 233 on the output shaft 231 and the rack 231 can also be realized. In one of the embodiments, the rack 231, the gear 233, and the micro motor 240 may also be mounted on the rear side of the card tray body 210, that is, the rack 231 can extends from the rear portion of the card tray body 210 to the mobile phone 100. The micro motor 240 is fixedly connected to a gear 233, and the rotational movement of the output shaft 241 of the micro motor 240 can be converted into a linear movement of the rack 231 through the engaging transmission between the gear 233 and the rack 231, such that the card tray body 210 can be pushed out of the slot 210 by the rack 231.

In one of the embodiments, the rack 231 is further provided with a limiting end 250, which prevents the card tray body 210 from being detached from the slot 110 during the moving of the card tray body 210 out of the slot 110. Referring to FIG. 2, the limiting end 250 may be directly provided as a protrusion on the distal end of the rack 231. When the distal end of the rack 231 away from the slot 110 moves to approach the slot 110, the protrusion can block the rack 231 from continually moving outward, preventing the card tray body 210 from being detached from the slot 110.

In alternative embodiments, the limiting end 250 can also have other structures, and the limiting end 250 can also be fixedly connected to the mobile phone body 100, so as to prevent the card tray body 210 from being detached from the slot 110, and details are not described herein again.

Referring to FIG. 1, in one of the embodiments, the card tray body 210 is further provided with a flange 211, and the flange 211 is latched with the slot 110 of the mobile phone body 100 when the card tray body 100 is about to move into the slot 110 completely, such that the card tray body 210 and the mobile phone body 100 form a secure connection. On the one hand, the flange 211 restricts the card tray body 210 from continually moving into the slot 110, on the other hand, a secure latching connection is formed between the flange 211 and the mobile phone body 100, the looseness of the card tray body 210 is prevented, which is advantageous for the SIM card or the memory card mounted on the card tray body 210 to be in good contact with the circuit in the mobile phone body 100.

Figure 3:
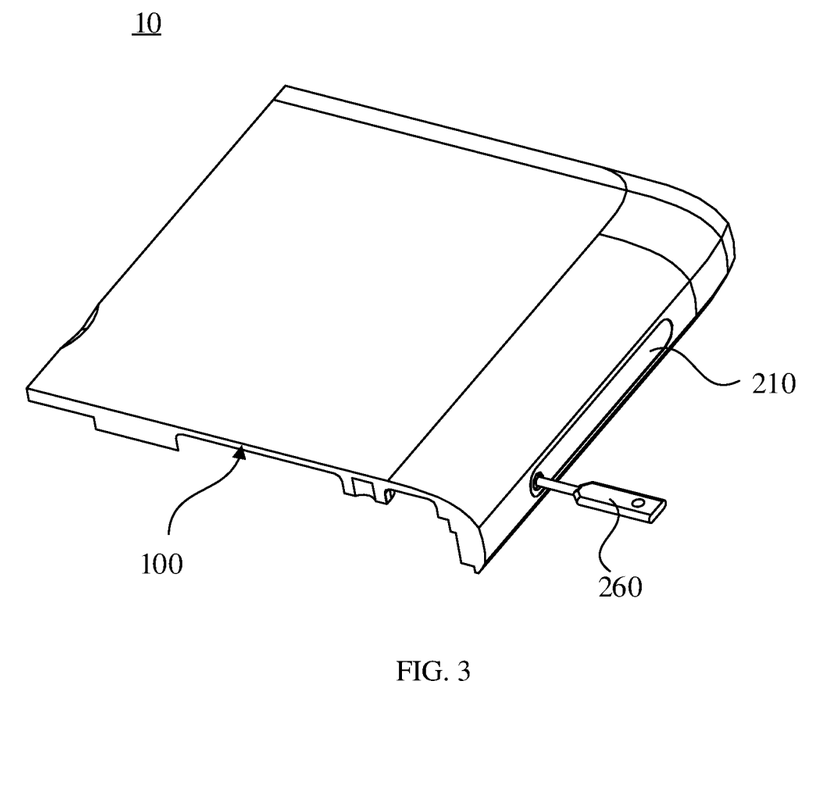
FIG. 3 is a perspective view of an opening hole inserted with an opening member of the mobile phone in FIG. 1.

In one of the embodiments, the card tray opening and closing mechanism 220 further includes an auxiliary opening portion (not shown) connected to the mobile phone body 100 and the card tray body 210, respectively. The auxiliary opening portion is capable of moving the card tray body 210 out of the slot 110. However, the auxiliary opening portion is different from the aforementioned electronically controlled card tray opening and closing mechanism 220 in that, the auxiliary opening portion uses a mechanical means to move the card tray body 210 out of the slot 100, and no electronically controlled structure is related. Referring to FIG. 2 and FIG. 3, the flange 211 of the card tray body 210 shown in FIG. 2 is provided with an opening hole 213, as shown in FIG. 3, after an opening member 260 inserts into the opening hole 213, the card tray body 210 can be moved out of the slot 110 by the auxiliary opening portion. In one of the embodiments, the auxiliary opening portion is a simple lever mechanism (not shown). The fulcrum of the lever is connected to the mobile phone body 100, when the opening member 260 inserts into the opening hole 213 to apply a force to one end of the lever, the other end of the lever can push the card tray body 210 out of the slot 110. When the mobile phone 10 is turned off, or when the electronically controlled card tray opening and closing mechanism 220 is not working normally, the card tray body 210 can be removed from the slot 110 by the auxiliary opening portion. The auxiliary opening portion of the card tray body 210 moves the card tray body 210 out of the slot 110 by mechanical connection, such that even if the mobile phone 10 is not turned on, the auxiliary opening portion can move the card tray body 210 out of the slot 110. When the mobile phone 10 fails, the auxiliary opening portion facilitates the user to take out the SIM card or the memory card in time, so as to prevent the SIM card or the memory card from damage.

Figure 4:
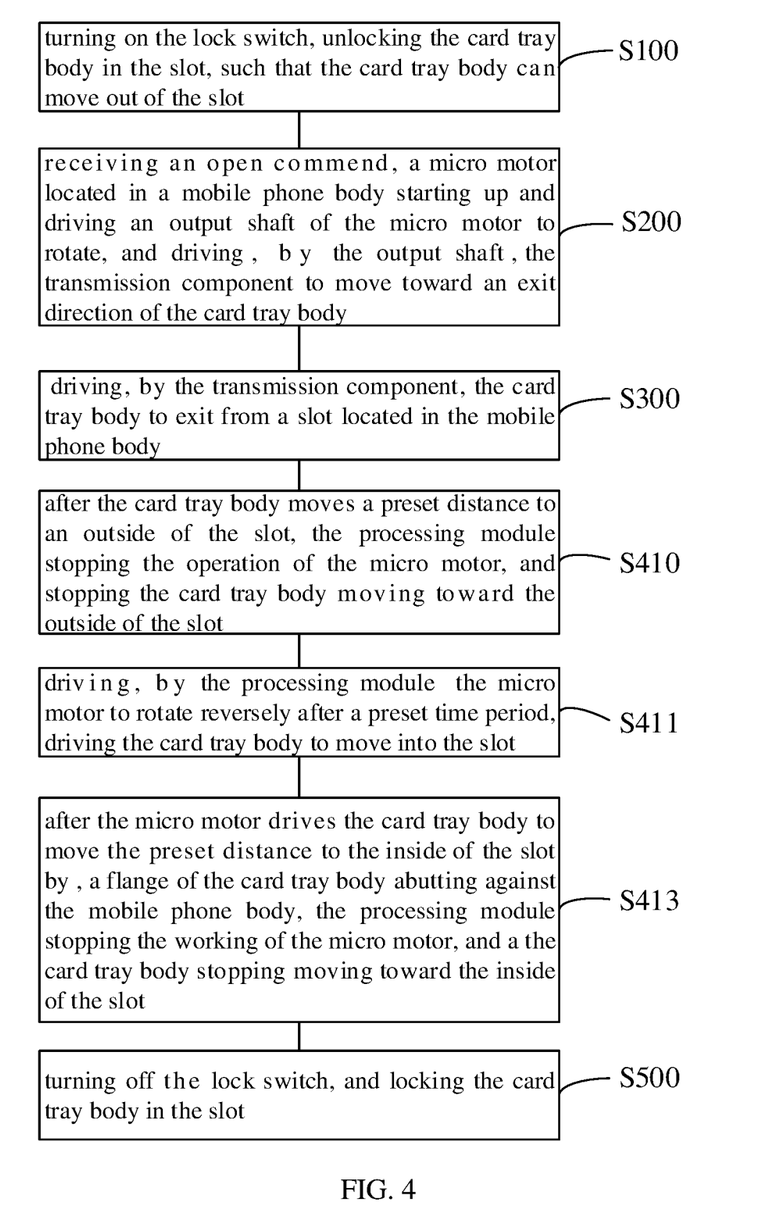
FIG. 4 is a flowchart of a mobile phone card tray opening and closing method according to an embodiment.

Referring to FIG. 4, in one of the embodiments, a card tray opening and closing method corresponding to the structures of the card tray 200 and the mobile phone body 10 is provided. The method includes following steps:

In step S100, a lock switch (not shown) is turned on, the card tray body 210 locked in the slot 110 is unlocked, such that the card tray body 210 can be moved out of the slot 110.

Specifically, the card tray opening and closing mechanism 220 drives the transmission assembly 230 by the micro motor 240, which in turn drives the card tray body 210 to move out of the slot 110, thereby converting the rotational movement of the output shaft 241 of the micro motor 240 into a translational movement of the card tray body 210. In order to prevent the micro motor 240 from accidentally starting up, the lock switch is provided on the mobile phone body 100, and the lock switch has two states, i.e., turning on and off. In the turned off state, the card tray body 210 is locked in the mobile phone body 100, the micro motor 240 cannot start up, and the card tray body 210 cannot be moved out of the slot 110. In the turned on state, the micro motor 240 can start up normally, and the micro motor 240 drives the transmission assembly 230 to move the card tray body 210 out of the slot 110 after the micro motor 240 starts up. The lock switch can be mechanical, and directly mechanically locks the output shaft 241 of the micro motor 240. It can also be a circuit switch connected in series to the control circuit of the micro motor 240. When the circuit switch is not turned on, the control circuit of the micro motor 240 is in an off state and the micro motor 240 cannot start up. The micro motor 240 can be normally operated only when the lock switch is turned on, and then the card tray body 210 is moved out of the slot 110 by the micro motor 240.

In step 200, an open command is received, the micro motor 240 located in the mobile phone body 100 starts up and drives the output shaft 241 of the micro motor 240 to rotate, and the rotating output shaft 241 drives the transmission assembly 230 to move toward an exit direction of the card tray body 210. The step S200 can be implemented in the following two ways.

In step 210, a physical open button (not shown) provided outside the mobile phone body 100 is pressed, and a processing module (not shown) in the mobile phone body 100 sends the opening command to the micro motor 240, and the micro motor 240 starts up.

The physical open button is a mechanical button provided on the mobile phone body 100, and the button is in communication with the control circuit of the micro motor 240 inside the mobile phone body 100.

Specifically, the physical open button functions as a sensor and can detect the user's opening operation. When the processing module detects that the user has a pressing operation on the open button, it is normally indicated that the user wants to move the card tray body 210 out of the slot 110. At this time, the open button can be connected to the processing module through the circuit on an end the open button, and the processing module receives the pressing operation of the open button, the control circuit of the micro motor 240 is turned on, and the micro motor 240 starts up.

In step 220, a virtual open button provided in an operating system of the mobile phone body 100 is triggered, and the processing module in the mobile phone body 100 sends the opening command to the micro motor 240, and the micro motor 240 starting up.

When the open button is the virtual open button established by a program, the program needs to be stored in the processing module of the mobile phone body 100 in advance. The processing module can be either a hardware module independent of the microprocessor in the mobile phone body 100 or be directly integrated in the microprocessor. When the user triggers the virtual open button set by the operating system of the mobile phone body 100, it is normally indicated that the user wants to move the card tray body 210 out of the slot 110. At this time, the operating system turns on the control circuit of the micro motor 240, and the micro motor 240 starts up.

In one of the embodiments, the transmission assembly 230 includes the rack 231 and the gear 233, and the step S220 may include following steps:

In step S221, the processing module connects the micro motor 240 to a power source, such that the power source can supply power to the micro motor 240.

Specifically, the processing module connects the micro motor 240 to the power source in a manner of turning on the circuit between the micro motor 240 and the power source, and the power source can supply power to the micro motor 240, such that the micro motor 240 can operate normally.

In step S223, the output shaft 241 of the micro motor 240 rotates, and drives the gear 233 on the output shaft 241 to rotate synchronously.

Specifically, the micro motor 240 can be a stepper motor, and the processing module sends a pulse electrical signal to the micro motor 240 through the control circuit of the micro motor 240, thereby controlling the rotation speed and the rotation angle of the micro motor 240. When the micro motor 240 is a normal motor, the processing module causes the control circuit of the micro motor 240 to continuously be turned on, the micro motor 240 operates normally, and the gear 233 connected to the output shaft 241 of the micro motor 240 also rotates synchronously. It should be understood that, the micro motor 240 can rotate clockwise or counterclockwise.

In step S225, the gear 233 drives the rack 231 engaged therewith to move toward the outside of the slot 110.

Specifically, when the control circuit of the micro motor 240 is turned on with the power source in the mobile phone body 100, the micro motor 240 operates normally, and the output shaft 241 of the micro motor 240 rotates normally, such that the gear 233 fixedly connected to the output shaft 241 of the micro motor 240 rotates synchronously along with the output shaft 241. Since the rack 231 connected to the card tray body 210 and the gear 233 on the output shaft 241 of the micro motor 240 are engaged with each other, when the gear 233 rotates, the rack 231 engaged with the gear 233 can generate a translational movement, thereby converting the rotational movement of the output shaft 241 of the micro motor 240 into the translational movement of the rack 231.

It should be noted that, in one of the embodiments, the card tray body 210 moves out of the slot 110 when the micro motor 240 rotates counterclockwise, and the card tray body 210 moves into the slot 110 when the micro motor 240 rotates clockwise. In alternative embodiments, the card tray body 210 moves into the slot 110 when the micro motor 240 rotates counterclockwise, and the card tray body 210 moves out of the slot 110 when the micro motor 240 rotates clockwise.

In step 300, the transmission assembly 230 drives the card tray body 210 to be removed from the slot 110 located in the mobile phone body 100.

In one of the embodiments, the transmission assembly 230 includes the gear 233 and the rack 231, since the rack 231 is fixedly connected to the card tray body 210, the rack 231 is driven by the gear 233 to generate the translational movement, and the card tray body 210 further moves toward the outside of the slot 110 driven by the rack 231, such that the card tray body 210 moves out of the slot 110.

According to the aforementioned steps, after the mobile phone body 100 receives the open command from the user, the micro motor 240 starts up, the output shaft 241 of the micro motor 240, and drives the transmission assembly 230 to move toward the exit direction of the card tray body 210, such that the transmission assembly 230 drives the card tray body 210 to be removed from the slot 110 located in the mobile phone body 100. According to the aforementioned card tray opening and closing method, the card tray body 210 can be removed from the slot without using an ejector pin, which not only improves the convenience of opening the card tray body 210, but also avoids the inconvenience of carrying the ejector pin.

In order to better control the movement of the card tray body 210 in the slot 110, after the step S300, the following steps may be further included.

In one of the embodiments, since the automatic control to the movement of the card tray body 210 is implemented, the card tray body 210 does not completely detached from the slot 110 during the movement, as long as the card tray body 210 can completely expose the mounting slot for the electronic card (SIM card or memory card). In this case, during the moving of the card tray body 210 in the slot 110, the following steps are included.

In step S410, after the card tray body 210 moves a preset distance toward the outside of the slot 110 by, the processing module stops the working of the micro motor 240, and the movement of the card tray body 210 to the outside of the slot 110 is stopped.

In one of the embodiments, the rack 231 is further provided with the limiting end 250, which prevents the card tray body 210 from being detached from the slot 110 during moving of the card tray body 210 out of the slot 110. The limiting end 250 may be directly provided as a protrusion on the distal end of the rack 231, and the protrusion is provided with a sensor. When the distal end of the rack 231 away from the slot 110 moves to approach the slot 110, the protrusion abuts against a wall of the slot 120, and when the processing module receives a limiting signal of generated by the sensor, it is indicated that the card tray body 210 has moved the preset distance in the slot 110, such that the processing module turns off the control circuit of the micro motor 240 with the power source, thereby limiting the rack 231 from continually moving outward, preventing the card tray body 210 from being detached from the slot 110. In alternative embodiments, the limiting sensor of the limiting end 250 can also located on other positions, and the function of preventing the card tray body 210 from being detached from the slot 110 can also be implemented, and details are not described herein again.

In step S411, after the card tray body 210 stops moving toward the outside of the slot 110, the processing module drives the micro motor 240 to rotate reversely after a preset time period is passed, and the card tray body 210 moves into the slot 110.

Since the card tray body 210 is moved out of the slot 110, the user can remove or replace the SIM card or the memory card on the card tray body 210. By setting the time to the processing module, after the card tray body 210 is moved out of the slot 110, the processing module can turn on the micro motor 240 to the power source again after the preset time period is passed, the micro motor 240 rotates reversely, and drives the card tray body 210 to move into the slot 110.

In one of the embodiments, the mobile phone body 100 is provided with a physical return button, when the physical return button is pressed, the processing module drives the micro motor 240 to rotate reversely, and the card tray body 210 moves into the slot 110.

In an alternative embodiment, the operating system of the mobile phone body 100 has a virtual return button, when the virtual return button is triggered, and the processing module also drives the micro motor 240 to rotate reversely, and the card tray body 210 moves into the slot 110.

By adding the step of automatically moving in, the card tray body 210 can be smoothly moved into the slot 110, and an insufficient engagement between the rack 231 on the card tray body 210 and the gear 233 when the user manually moves the card tray body 210, which causes damage to the engaging area therebetween, can be avoided.

In step S413, after the micro motor 240 drives the card tray body 210 to move a preset distance toward the inside of the slot 110, the flange 211 of the card tray body 210 abuts against the mobile phone body 100, the processing module stops the working of the micro motor 240, and the moving of the card tray body 210 toward the inside of the slot 110 is stopped.

Specifically, after the card tray body 210 moves out of the slot 110, the processing module turns on the micro motor 240 to the power source again after the preset time period is passed, and the micro motor 240 drives the card tray body 210 to move into the slot 110. During the moving of card tray body 210 into the slot 110, unlike the limiting sensor of the process of moving out, the card tray body 210 is fabricated with the flange 211, and the mobile phone body 100 is provided with a stopping sensor. The function of the stopping sensor is that, when the card tray body 210 moves the preset distance into the slot 110, the flange 211 of the card tray body 210 abuts against the wall of the slot 110 of the mobile phone body 100, and the stopping sensor sends a stopping electrical signal to the processing module. When the processing module receives the stopping electrical signal, the micro motor 240 is turn off with the power source, and the card tray body 210 stops moving into the slot 110.

In an alternative embodiment, the card tray body 210 can be completely detached from the slot 110 during the movement. In this case, the user is required to manually move the card tray body 210 into the slot 110. During the moving of the card tray body 210 into the slot 110, the above steps S410, S411 and S413 can be replaced with the following steps S420 and S421.

In step S420, the card tray body 210 is pushed to move into slot 110, the rack 231 on the card tray body 210 is engaged with the gear 233 on the output shaft 241, the processing module controls the micro motor 240 to rotate, and the micro motor 240 drives the card tray body 210 to move into the slot 110.

Specifically, the moving of the card tray body 210 into the slot 110 implements a semi-automatic manner. The card tray body 210 can be completely detached from the slot 110, after the user removes or replaces the electronic card (SIM card or memory card) on the card tray body 210, the card tray body 210 needs to be manually loaded into the slot 110. An access sensor is located in the card tray body 210, when the access sensor detects that the rack 231 on the card tray body 210 is engaged with the gear 233 on the output shaft 241, the access sensor sends an electrical signal to the processing module, and the processing module controls the micro motor 240 to start up, and the micro motor 240 drives the card tray body 210 to move into the slot 110. This step allows the user to freely control the length of time of taking out of the card tray, and facilitates the user to remove or replace the SIM card or the memory card on the card tray body 210. However, in order to smoothly move the card tray body 210 into the slot 110, and prevent the rack 231 on the card tray body 210 from being misaligned with the gear 233, resulting in damage to the engaging portion, the access sensor is added to realize semi-automatic movement of the card tray body 210, which can still improve the convenience of the user, and the service life of the gear 233 and the rack 231 can be extended.

In step S421, after the micro motor 240 drives the card tray body 210 to move the preset distance toward the inside of the slot 110, the flange 211 of the card tray body 210 abuts against the mobile phone body 100, the processing module turns off the micro motor 240 with the power source, and of the card tray body 210 stops moving toward the inside of the slot 110.

Similarly, during the moving of the card tray body 210 into the slot 110, due to the flange 211 provided on the card tray body 210 and the stopping sensor provided on the mobile phone body 100, when the card tray body 210 moves the preset distance into the slot 110, the flange 211 of the card tray body 210 abuts against the wall of the slot 110 of the mobile phone body 100, and the stopping sensor sends a stopping electrical signal to the processing module. When the processing module receives the stopping electrical signal, the micro motor 240 is turn off with the power source, and the movement of the card tray body 210 into the slot 110 is stopped.

In step S500, the lock switch is turned off, the card tray body 210 is locked in the slot 110.

Similarly, in order to prevent the micro motor 240 from accidentally starting up, after the card tray body 210 moves into the slot 110, the lock switch is required to be turned off. When the lock switch is turned off, the card tray body 210 is locked in the mobile phone body 100, the micro motor 240 cannot start up, and the card tray body 210 cannot be moved out of the slot 110.

It should be understood that, the automatic or semi-automatic control process for the aforementioned card tray opening and closing method can be implemented by a simple logic circuit, which is not an improvement of the control program. The purpose of the program or the microprocessor inside the mobile phone body 100 is to more conveniently control the opening and closing of the card tray body, rather than an improvement to the program or the microprocessor.

The technical features of the embodiments described above can be arbitrarily combined. In order to make the description succinct, there is no describing of all possible combinations of the various technical features in the foregoing embodiments. It should be noted that there is no contradiction in the combination of these technical features which should be considered as the scope of the description.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

What is claimed is:

1. A card tray opening and closing mechanism configured to move a card tray body into or out of a slot of a mobile phone body, the card tray opening and closing mechanism comprising:
   a micro motor fixedly connected in the mobile phone body and configured to be communicatedly connected to the mobile phone body, the micro motor comprising an output shaft; and
   a transmission assembly comprising a gear and a rack, wherein the gear is fixedly connected to the output shaft of the micro motor, the rack is configured to be fixed to the card tray body, and the gear is engaged with the rack in such a manner that when the output shaft of the micro motor rotates, the gear rotates synchronously with the output shaft to drive the rack engaged therewith to move the card tray body into or out of the slot.

2. The card tray opening and closing mechanism according to claim 1, wherein the rack is integrally formed on a side of the card tray body, or the rack is detachably connected to the card tray body.

3. The card tray opening and closing mechanism according to claim 1, wherein the rack is provided with a limiting end configured to prevent the card tray body from being detached from the slot during moving of the card tray body out of the slot.

4. The card tray opening and closing mechanism according to claim 1, wherein the transmission assembly is located at a rear side of the card tray body, the micro motor rotates and enables the transmission assembly to move toward an exit direction of the card tray body, such that the card tray body is pushed out of the slot.

5. The card tray opening and closing mechanism according to claim 1, wherein the transmission assembly is located at a lateral side of the card tray body, the micro motor rotates and enables the transmission assembly to move toward an exit direction of the card tray body, such that the card tray body is removed from the slot.

6. The card tray opening and closing mechanism according to claim 1, wherein the micro motor is a stepper motor.

7. The card tray opening and closing mechanism according to claim 1, further comprising an auxiliary opening portion connected to the mobile phone body and the card tray body, respectively, wherein the auxiliary opening portion is capable of moving the card tray body out of the slot.

8. A card tray configured to be mounted in a mobile phone body, comprising a card tray body and the card tray opening and closing mechanism according to claim 1, wherein the card tray body is connected to the card tray opening and closing mechanism, and the card tray body is capable of moving into or out of the slot via the card tray opening and closing mechanism.

9. A mobile phone, comprising a mobile phone body and the card tray according to claim 8, wherein the card tray is mounted in the mobile phone body, the mobile phone body comprises a microprocessor, and the micro motor is communicatedly connected to the microprocessor.

10. The mobile phone according to claim 9, wherein the card tray body is provided with a flange, and the flange is latched with the mobile phone body during moving of the card tray body into the slot.

11. A card tray opening and closing method, comprising:
receiving an open command;
starting up a micro motor located in a mobile phone body and driving an output shaft of the micro motor to rotate, and driving, by the output shaft, a transmission assembly to move toward an exit direction of a card tray body;
driving, by the transmission assembly, the card tray body to be removed from a slot located in the mobile phone body;
putting in or taking out an electronic card in the card tray body; and
pushing the card tray body to move toward an inside of the slot, such that a rack of the card tray body is engaged with a gear of the output shaft, and controlling, by a processing module, the output shaft of the micro motor to rotate, such that the gear rotates synchronously with the output shaft to drive the rack engaged therewith to move the card tray body into the slot.

12. The card tray opening and closing method according to claim 11, wherein receiving the open command comprises:
pressing a physical open button provided outside the mobile phone body; and
sending, by a processing module in the mobile phone body, the opening command to the micro motor, such that the micro motor starts up.

13. The card tray opening and closing method according to claim 11, wherein receiving the open command comprises:
triggering a virtual open button provided in an operating system of the mobile phone body; and
sending, by a processing module in the mobile phone body, the opening command to the micro motor, such that the micro motor starts up.

14. The card tray opening and closing method according to claim 12, wherein driving, by the transmission assembly, the card tray body to be removed from the slot located in the mobile phone body further comprises:
after the card tray body moves a preset distance toward an outside of the slot, stopping, by the processing module, working of the micro motor, and stopping moving of the card tray body toward the outside of the slot.

15. The card tray opening and closing method according to claim 14, wherein after the card tray body stops to move toward the outside of the slot, the processing module drives the micro motor to rotate reversely after a preset time period is passed, or by detecting operation of a physical return button provided on the mobile phone body, or by triggering a virtual return button of the operating system, such that the micro motor drives the card tray body to move into the slot.

16. The card tray opening and closing method according to claim 14, wherein after the micro motor drives the card tray body to move a preset distance toward the inside of the slot, a flange of the card tray body abuts against the mobile phone body, the processing module stops working of the micro motor, and the card tray body stops moving toward the inside of the slot.

17. The card tray opening and closing method according to claim 16, wherein after the card tray body stops moving toward the inside of the slot, the method further comprises:
turning off a lock switch located on the mobile phone body, and locking the card tray body in the slot.

18. The card tray opening and closing method according to claim 17, wherein prior to receiving the open command, the method further comprises:
turning on the lock switch, unlocking the card tray body in the slot, such that the card tray body is capable of moving out of the slot.

* * * * *